United States Patent
Rainish et al.

(10) Patent No.: US 10,587,334 B2
(45) Date of Patent: Mar. 10, 2020

(54) METHOD AND A SYSTEM FOR USE IN A SATELLITE COMMUNICATIONS SYSTEM

(71) Applicant: SATIXFY ISRAEL LTD., Rehovot (IL)

(72) Inventors: Doron Rainish, Ramat Gan (IL); Yoel Gat, Ramat Raziel (IL); Avraham Freedman, Tel Aviv (IL)

(73) Assignee: SATIXFY ISRAEL LTD., Rehovot (IL)

( * ) Notice: Subject to any disclaimer, the term of this patent is extended or adjusted under 35 U.S.C. 154(b) by 7 days.

(21) Appl. No.: 15/766,072

(22) PCT Filed: Sep. 29, 2016

(86) PCT No.: PCT/IL2016/051066
§ 371 (c)(1),
(2) Date: Apr. 5, 2018

(87) PCT Pub. No.: WO2017/060898
PCT Pub. Date: Apr. 13, 2017

(65) Prior Publication Data
US 2019/0123810 A1      Apr. 25, 2019

Related U.S. Application Data

(60) Provisional application No. 62/238,751, filed on Oct. 8, 2015.

(51) Int. Cl.
*H04B 7/185* (2006.01)
*H03M 13/29* (2006.01)
(Continued)

(52) U.S. Cl.
CPC ........ *H04B 7/18526* (2013.01); *G06F 11/10* (2013.01); *H03M 13/2796* (2013.01);
(Continued)

(58) Field of Classification Search
CPC .......... H04B 7/18526; H03M 13/2796; H03M 13/3927; G06F 11/10; H04H 20/74;
(Continued)

(56) References Cited

U.S. PATENT DOCUMENTS 5,970,085 A * 10/1999 Yi .................... H03M 13/2957
370/342
6,944,139 B1    9/2005 Campanella
(Continued)

FOREIGN PATENT DOCUMENTS

EP        1072132 B1    11/2001

*Primary Examiner* — Kiet Tang
(74) *Attorney, Agent, or Firm* — Browdy and Neimark, PLLC

(57) ABSTRACT

A method and a system are provided for use in a satellite communications network in which broadcasting services are provided to a mobile terminal. The method comprises: duplicating bits comprised in communications which the satellite is about to broadcast, thereby forming a first stream of bits and a second stream of bits; conveying the first stream of bits in an encoded form along a satellite channel whereas the second stream of bits is conveyed in an encoded form along a terrestrial channel; and combining bits conveyed along the satellite channel with bits conveyed along the terrestrial channel in order to obtain a combined stream of bits.

11 Claims, 5 Drawing Sheets

(51) Int. Cl.
    *H04B 7/14*         (2006.01)
    *H03M 13/11*       (2006.01)
    *H04H 20/51*       (2008.01)
    *H04H 40/90*       (2008.01)
    *H04H 20/72*       (2008.01)
    *H04H 20/22*       (2008.01)
    *H04H 20/74*       (2008.01)
    *H04H 20/18*       (2008.01)
    *G06F 11/10*       (2006.01)
    *H03M 13/27*       (2006.01)
    *H03M 13/39*       (2006.01)

(52) U.S. Cl.
    CPC ........ *H03M 13/3927* (2013.01); *H04H 20/18* (2013.01); *H04H 20/22* (2013.01); *H04H 20/51* (2013.01); *H04H 20/72* (2013.01); *H04H 20/74* (2013.01); *H04H 40/90* (2013.01)

(58) Field of Classification Search
    CPC ........ H04H 20/18; H04H 20/72; H04H 20/51; H04H 20/22; H04H 40/90
    See application file for complete search history.

(56) References Cited

U.S. PATENT DOCUMENTS

| | | | |
|---|---|---|---|
| 2005/0276239 A1 | 12/2005 | Smallcomb | |
| 2012/0106598 A1* | 5/2012 | Kim | H04B 7/14 375/211 |
| 2013/0215996 A1* | 8/2013 | Boutros | H03M 13/1102 375/295 |

* cited by examiner

METHOD AND A SYSTEM FOR USE IN A SATELLITE COMMUNICATIONS SYSTEM

FIELD OF THE DISCLOSURE

The present disclosure relates to the field of communications and in particularly to communications exchanged in a satellite communications network.

BACKGROUND OF THE DISCLOSURE

Satellite radio has been very successful, especially in the US with the Sirius XM radio, in which transmissions are made via dedicated satellites in S-Band.

S band is part of the microwave band of the electromagnetic spectrum, which extends to frequencies at the range of from 2 to 4 GHz.

In the US, the FCC approved satellite-based Digital Audio Radio Service (DARS) broadcasting in the S band at the sub range of from 2.31 to 2.36 GHz, which is currently used by Sirius XM radio. More recently, it has approved for portions of the S band between 2.0 and 2.2 GHz the creation of Mobile Satellite Service (MSS) networks in connection with Ancillary Terrestrial Components (ATC). There are presently a number of companies attempting to deploy such networks.

In some countries, S band is used for Direct-to-Home satellite television (unlike similar services in most countries, which use $K_a$ band). The frequency typically allocated for this service is 2.5 to 2.7 GHz (LOF 1.570 GHz).

However, with the ever growing demand for the world's communication frequency bands, e.g. for cellular phones, streaming entertainment, data communications, civil and commercial providers, incredible strains are placed on available spectrum bandwidth. In the electromagnetic spectrum, many NASA missions use S-band for communications, therefore commercial businesses have put pressure on the US government to free up other bands within the electromagnetic spectrum.

Consequently, a new part of the electromagnetic spectrum called $K_a$-band has been opened and with the need to speed up transmissions, $K_a$-band, has been considered a promising spectrum for communications. Compared with S-band, $K_a$-band has data transmission rates that are hundreds of times faster and enables global coverage with local high gain spot beams.

The $K_a$ band covers frequencies range of from about 26.5 to about 40 GHz, i.e. wavelengths from slightly over one centimeter down to 7.5 millimeters. The $K_a$ band is part of the K band of the microwave band of the electromagnetic spectrum. The 30/20 GHz band is used in satellites communications, where the uplink transmissions are transmitted in either the 27.5 GHz and 31 GHz bands, and high-resolution, close-range targeting radars aboard military airplanes. Some frequencies in this radio band are used for vehicle speed detection by law enforcement.

The $K_u$ band covers frequencies range of from about 12 to about 18 GHz portion of the electromagnetic spectrum in the microwave range of frequencies. The $K_u$ band is primarily used for satellite communications, including the provisioning of fixed and broadcast services. $K_u$ band satellites are also used for backhauls and particularly for satellite from remote locations back to a television network's studio for editing and broadcasting.

When considering the $K_a$ band or $K_u$ band, or even higher frequencies, as the media for transmissions for mobile terminals, one of the major problems is the problem of blockage. As known in the art, a blockage protection system based on very long interleaving and long period storage of the received signal, makes it possible to overcome blockage periods of several seconds. The satellite radio signal being a relatively low bandwidth signal with a very high latency tolerance, makes the solution feasible and cost-effective.

However, as in the case of Sirius XM radio, terrestrial augmentation would be required. Typically, such an augmentation could not rely on $K_a$-band transmissions as those provide only very short range coverage for a terrestrial link.

SUMMARY OF THE DISCLOSURE

Therefore, it is an object of the present invention to provide a method and a system to enable augmentation of transmissions in order to reduce blockage in satellite transmissions.

It is another object of the present invention to provide a method and a system to enable reducing blockage interference experienced by a mobile terminal, in transmissions broadcasted at the $K_a$ or the $K_u$ frequency bands.

Other objects of the present invention will become apparent as the description of the invention proceeds.

According to a first embodiment of the disclosure there is provided a method for use in a satellite communications network for providing broadcasting services to a mobile terminal, wherein the method comprises:

duplicating bits comprised in communications to be broadcasted by a satellite, thereby forming a first stream of bits and a second stream of bits;

conveying the first stream of bits in an encoded form along a satellite channel and the second stream of bits in an encoded form along a terrestrial channel; and combining bits conveyed along the satellite channel with bits conveyed along the terrestrial channel to obtain a combined stream of bits.

According to another embodiment, the combining of bits conveyed along the satellite channel with bits conveyed along the terrestrial channel, is based on at least a computed Log Likelihood Ratio (LLR) calculated for the conveyed bits.

In accordance with another embodiment, the step of conveying the first stream of bits comprises:

encoding input bits comprised in the communications that will be transmitted from the satellite;

applying a rate matching mechanism upon the encoded bits;

interleaving the encoded bits by performing a pre-determined permutation thereon;

modulating the interleaved bits and transmitting the modulated bits towards a receiver;

receiving the modulated bits;

demodulating the received bits;

performing an inverse permutation on the demodulated bits;

calculating a corresponding LLR for each of the received bits;

combining the demodulated bits that have undergone the inverse permutation with corresponding bits received from the terrestrial channel; and outputting the combined bits by the mobile terminal.

According to still another embodiment, the step of conveying the second stream of bits comprises:

applying a rate matching mechanism upon bits to be conveyed along the terrestrial channel in their encoded form;

interleaving the encoded bits by performing a pre-determined permutation thereon;

modulating the interleaved bits and transmitting the modulated bits towards a receiver;

receiving the modulated bits;

demodulating the received bits;

performing an inverse permutation on the demodulated bits; and synchronizing forwarding of the demodulated bits that have undergone the inverse permutation, for their combination with corresponding bits that have undergone inverse permutation at the satellite channel.

By yet another embodiment, the step of interleaving the encoded bits further comprises carrying out de-repetition and de-puncturing, wherein punctured bits are replaced by LLR of the value 0.

According to still another embodiment, the encoding mechanism applied on bits for their conveyance along the satellite channel and on bits to be conveyed along the terrestrial channel, is the same.

In accordance with another embodiment, the encoding mechanism is of low-density parity-check (LDPC) type.

In an alternative embodiment, the encoding mechanism applied on bits belonging to the first stream of bits is different from the encoding mechanism applied on bits belonging to the second stream of bits.

According to still another embodiment, the step of interleaving the encoded bits comprises applying a concatenation of two interleavers. Optionally, one of these two interleavers is a convolutional interleaver and the other is a pseudo random block interleaver.

By yet another embodiment the broadcasted communications are transmitted at a frequency within a frequencies range extending from about 12 to about 40 GHz.

According to another aspect of the disclosure there is provided a system for providing broadcasting services to a mobile terminal in a satellite communications network, the system comprising:

a first sub-system configured to convey a first stream of bits in an encoded form along a satellite channel;

a second sub-system configured to convey a second stream of bits, being a duplicate of the first stream of bits, in an encoded form along a terrestrial channel;

wherein the first sub-system comprises:

a processor configured to calculate a Log Likelihood Ratio (LLR) for each of the bits received along the satellite channel, and a combiner configured to combine bits received along both the satellite and the terrestrial channels into combined bits, based on at least the respective LLR calculated by the processor.

According to an embodiment of this aspect of the disclosure, the first sub-system further comprises:

an encoder configured to encode the first stream of bits that will be transmitted along the satellite channel;

a processor configured to:

apply a rate matching mechanism upon the encoded bits;

interleave encoded bits by performing a pre-determined permutation thereon; and modulate the interleaved bits;

a transmitter configured to transmit the modulated bits along a satellite channel towards a receiver;

a receiver configured to receive the modulated bits;

a processor configured to:

demodulate the received bits;

calculate a corresponding LLR for each of the received bits;

perform an inverse permutation on the demodulated bits;

combine the demodulated bits that have undergone the inverse permutation with corresponding bits received from the terrestrial channel; and output the combined bits.

According to still another embodiment of this aspect of the disclosure, the second sub-system comprises:

a processor configured to:

apply a rate matching mechanism upon the second stream of bits in their encoded form;

interleave encoded bits by performing a pre-determined permutation thereon; and modulate the interleaved bits;

a transmitter configured to transmit the modulated bits along a terrestrial channel towards a receiver;

a receiver configured to receive the modulated bits;

a processor configured to:

demodulate the received bits;

perform an inverse permutation on the demodulated bits; and synchronize forwarding of the demodulated bits that have undergone the inverse permutation, for their combining with corresponding bits conveyed within the first sub-system.

In accordance with another embodiment, the processor of the first sub-system is further configured to carry out de-repetition and de-puncturing of the bits contained in said first stream of bits following their interleaving, and wherein punctured bits are replaced by LLR of the value 0.

By yet another embodiment, the second stream of bits is forwarded to the second sub-system already in its encoded form (e.g. where the encoding of the bits included in the second stream of bits is carried out by the encoder of the first sub-system).

According to another embodiment the encoder of the first sub-system is of the low-density parity-check (LDPC) type.

In accordance with another embodiment, the encoding of the second stream of bits is carried out by an encoder comprised in the second sub-system, which is preferably different from the encoder comprised in the first sub-system.

By still another embodiment, the processor is configured to carry out the interleaving the encoded bits by applying a concatenation of two interleavers. Optionally, one of the two interleavers is a convolutional interleaver and the other is a pseudo random block interleaver.

In accordance with another embodiment, the transceiver is configured to transmit the first stream of bits at a frequency within a frequencies range extending from about 12 GHz to about 40 GHz.

BRIEF DESCRIPTION OF THE DRAWINGS

The present invention will be more fully understood from the following detailed description of the embodiments thereof, taken together with the drawings in which:

FIGS. 3A and 3B illustrate results obtained for a code word error probability as a function of the interleaver length, wherein:

FIG. 3A illustrates the results for interleaver failure rate as a function of the code erasure correction capability for highway channel model; and FIG. 3B illustrates the results for interleaver failure rate as a function of the code erasure correction capability for urban channel model;

FIG. 4A illustrates such a method in which a simple LLR addition is implemented when the information from the two channels is combined;

FIG. 4B illustrates such a method in which an iterative process is carried out between the two decoders when the information from the two channels is combined;

FIG. 5A illustrates such a method in which a simple LLR addition is implemented when the information from the two channels is combined;

FIG. 5B illustrates such a method in which an iterative process is carried out between the two decoders when the information from the two channels is combined.

DETAILED DESCRIPTION OF THE DISCLOSURE

In the following description, for the purposes of explanation, numerous specific details are set forth in order to provide a better understanding of the present invention by way of examples. It should be apparent, however, that the present invention may be practiced without these specific details.

Figure 1:
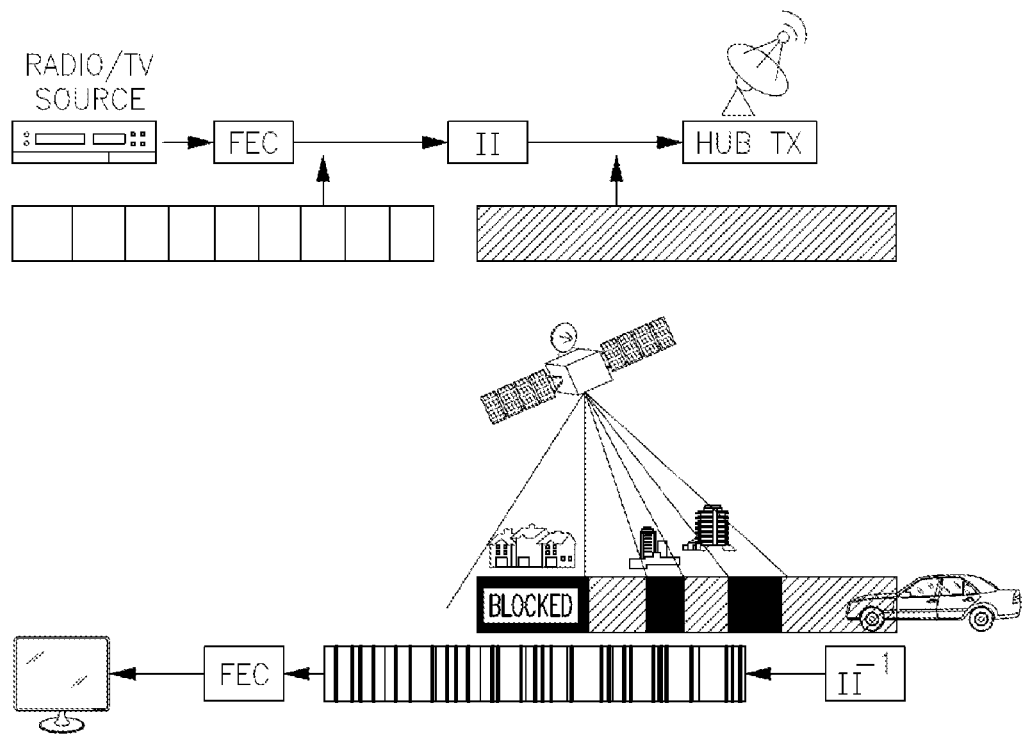
FIG. 1 demonstrates a system for carrying out an embodiment according to the present invention.

A system implementing the present invention is schematically illustrated in FIG. 1. In this system, the blockage protection referred to herein is based on a combination of a long interleaver and a low rate, erasure resilient error correcting code. The erasure resiliency of the code is preferably a function of the Line of Sight (LOS) Signal to Noise Ratio (SNR) and the code rate. Thus, during fading, the blockage resiliency is lower, but during low blockage probability intervals, the code will be able to endure deep fades.

For a given LOS probability to SNR ratio, if a perfect interleaver and a long enough code word are used, the success of decoding a code word will depend on the percentage of blockage (erasures) occurring during the time period required for the interleaving, which spans the specific code word. In order to calculate this success probability, a blockage model typically needs to be assumed.

Land mobile channel models frequently use A Markov model (as described for example by E. Lutz, et al. in "The land mobile satellite communication channel-recording, statistics and channel model" IEEE Transactions on Vehicular Technology, vol. 40, pp. 375-386, 1991).

Figure 2:
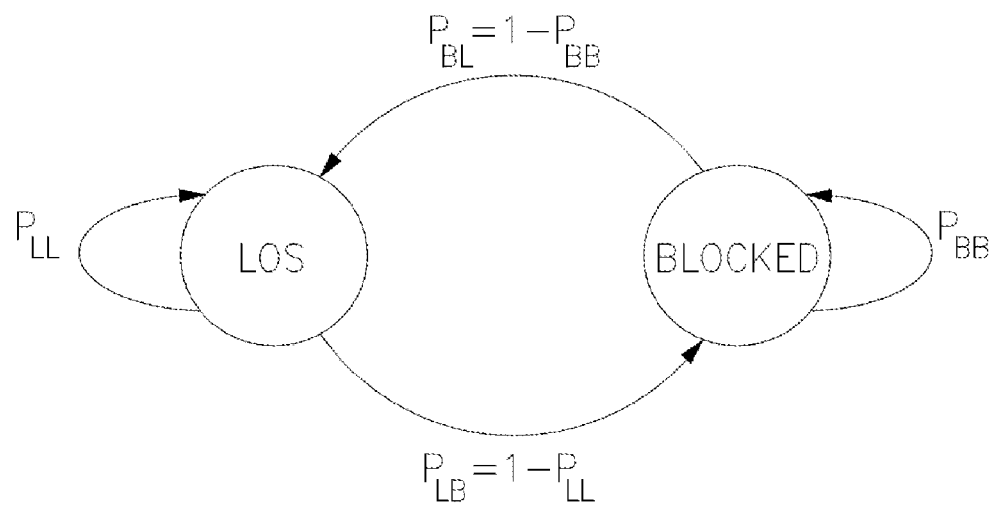
FIG. 2 illustrates a two states Markov chain blockage model.

In a simple channel model, yet a rather useful one, a two states Markov chain is used, as illustrated in FIG. 2. This model is defined by the state transition probabilities as well as by the state transition time. For example, $P_{LB}$ is the probability that given the system is in a LOS state, it will be in the block state in the next time step.

The state transition probability matrix for the model shown in FIG. 2 may be presented by the following Eq. 1, wherein:

$$P = \begin{bmatrix} P_{LL} & P_{LB} \\ P_{Dl} & P_{DD} \end{bmatrix} \quad \text{Eq. [1]}$$

The above channel model is based on an ergodic regular Markov chain. A Markov chain is referred to as being ergodic if it allows moving from every state to every state, not necessarily in one move. Further, when the state transition matrix comprises no zeros, the chain is referred to as a regular chain.

The limiting matrix W may be defined as follows:

$$W = \lim_{n \to \infty} P^n \quad \text{Eq. [2]}$$

Where each row of the limiting matrix W is a fixed row vector w, of which the components are the states probabilities. It may be shown that $$wP = w \quad \text{Eq. [3]}$$

so, when taken together with the relation $$\Sigma_i w_j = 1 \quad \text{Eq. [4]}$$

W may be calculated if P is known.

Now, the fundamental matrix Z is defined as:

$$Z = (1 - P + W)^{-1} \quad \text{Eq. [5]}$$

The expected number of steps to reach state j when starting from state i (mean first passage time) $m_{ij}$ is given by:

$$m_{ij} = \frac{z_{jj} - z_{ij}}{w_j} \quad \text{Eq. [6]}$$

Now, let $S_j^{(n)}$ be a random variable which denotes the number of times that the chain is at state j within the first n steps. Based on the central limit theorem, it may be shown that $S_j^{(n)}$ is normally distributed with mean $nw_j$ and asymptotic variance:

$$\sigma_j^2 = nw_j(2z_{jj} - 1 - w_j) = nC_j \text{ where } C_j = w_j(2z_{jj} - 1 - w_j) \quad \text{Eq. [7]}$$

If state j represents a LOS state, the probability that this state will be occupied more than T step times during n steps approaches (for a large value of n) is:

$$P_{T,n} \to Q\left(\frac{T - nw_j}{\sqrt{nC_j}}\right) \text{ where } Q = \quad \text{Eq. [8]}$$

$$\frac{1}{\sqrt{2\pi}} \int_x^\infty \exp\left(-\frac{x^2}{2}\right) dx \text{ is the } Q \text{ function}$$

For the two states diagram illustrated in FIG. 2, when using the above equations, one may easily be shown that: $W_{LOS} = P_{BL}/(P_{LB} + P_{BL})$ where $W_{LOS}$ being the LOS state probability, and $W_{Block} = P_{LB}/(P_{LB} + P_{BL})$ where $W_{Block}$ is the block state probability, using the relationships of $D_{LOS} = 1/P_{LB}$, where $D_{LOS}$ is the average number of steps in which the system is in state LOS, and $D_{Block} = 1/P_{BL}$, where $D_{Block}$ being the average number of steps in which the system is in the block state. Thus, the asymptotic variance of state LOS (Eq. [7]) results in:

$$\sigma_{LOS}^2 = nC_{LOS} \quad \text{Eq. [9]}$$

where $$C_{LOS} = w_{LOS} w_{Block} (2 w_{LOS} D_{Block} - 1) = w_{LOS} w_{Block} (2 w_{Block} D_{LOS} - 1) \quad \text{Eq. [10]}$$

and n is the interleaver length in Markov chain steps.

Using Eq. [8], the decode probability, i.e., the probability that the percentage of blockage time during the interleaver time span, will be less than the code erasure correction capability $C_E$, is provided by:

$$P_{decode} \rightarrow Q\left[\sqrt{n} \, \frac{w_{Block} - C_E}{\sqrt{C_{LOS}}}\right] \quad \text{Eq. [11]}$$

Figure 3A:
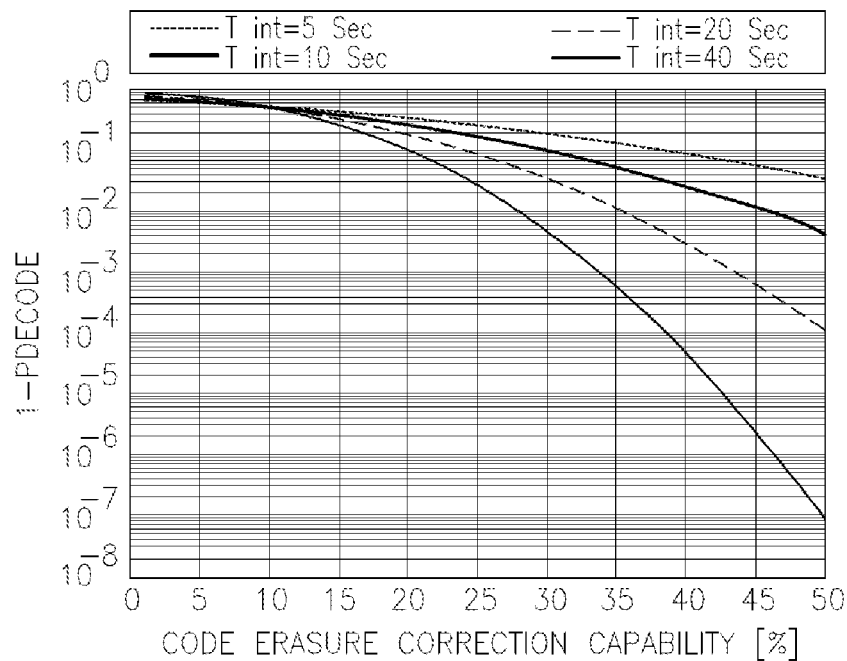
Figure 3B:
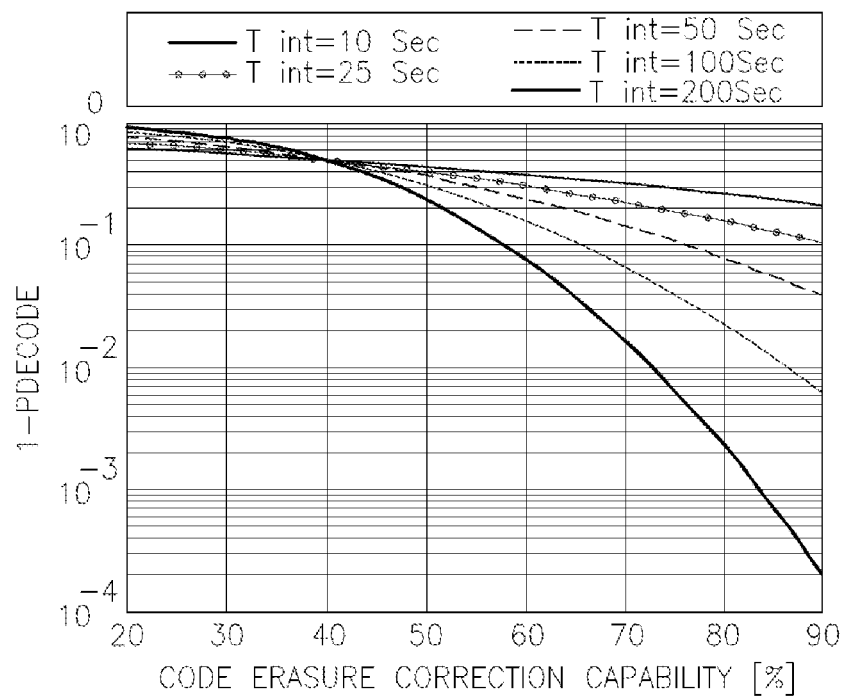

FIG. 3 demonstrates the results of calculations made of decode error probabilities for two channel models, where the models statistics were taken as follows: for the highway channel $W_{LOS}$=0.9 and $D_{LOS}$=18 seconds whereas for the urban channel $W_{LOS}$=0.6 and $D_{LOS}$=22 seconds.

It has been demonstrated in the past that for a typical driving pattern (which is composed of out of city driving together with urban driving), using a long interleaver provides very good results, still, if driving is done mainly in urban areas this solution is a rather problematic one.

In order to overcome this problem, the solution provided by the present invention proposes that the satellite and the terrestrial repeater operate under different operating conditions as will be further explained, and the signals generated at these two sources will be combined by applying a terrestrial augmentation. Such a combination of the two signals, may be carried out by implementing any one of a number of options. For example, the satellite and the terrestrial repeater use the same code but with different interleavers. In other words, the signals might be different in bandwidth, modulation and/or interleaving pattern, but by this embodiment, they are both are produced using the same code, and their combination is made at the decoder based on soft LLR information combination on a per bit basis.

According to another embodiment of the disclosure, the two (or more) signals received from the satellite and from the terrestrial repeater(s) are coded differently, and their combination is carried out at the decoders' outputs, rather than have them combined at the decoders' input, as was done in the previous embodiment.

Let us revert now to the system illustrated in FIG. 1, in which with terrestrial augmentation, the Radio/TV source is further transmitted using a terrestrial part of the system, which operates under different conditions from those used for the operation of the satellite. For example, a different frequency band may be used by the terrestrial part of the system than the band used by the satellite, a different modulation, a different interleaver and/or a different forward error correction (FEC) encoder.

Modern FEC, like Turbo Codes or low-density parity-check (LDPC) are decoded by using soft decisions and by computing the Log Likelihood Ratio (LLR), which is the logarithm of the ratio between the probability that a given bit is a "zero" to the probability it is a "one". Each of these probabilities are aposteriori probabilities, and computed by taking into account two probabilities: one computed according to the signal received for that bit and the other is a prior knowledge probability provided to the decoder by another source. Such another source can be derived for example from other bits, which relate to the specific encoded bit by the coding scheme, as done in the case of LDPC, or from another decoder, as in the case of Turbo codes.

Figure 4A:
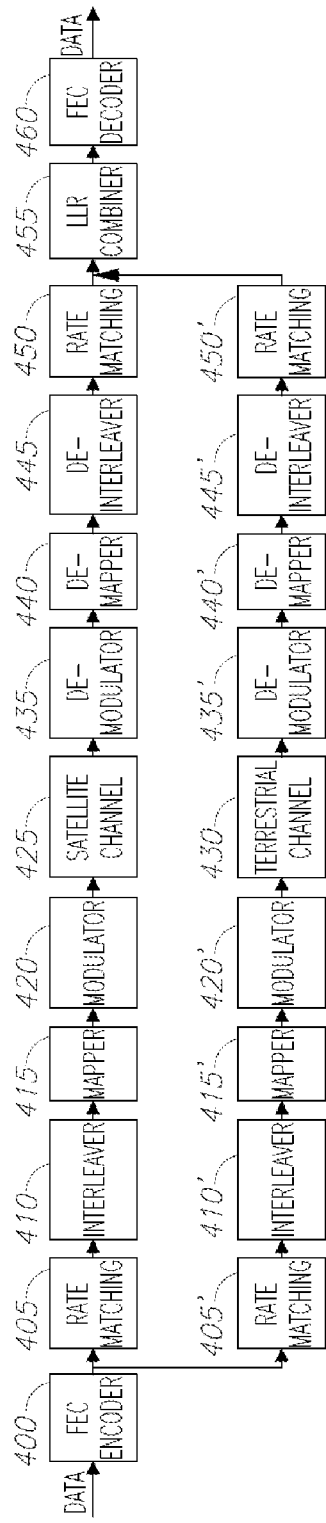
FIGS. 4A and 4B present a schematic illustration of a method implemented according to an embodiment of the present invention for combining information conveyed along a satellite channel and a terrestrial channel, where both channels use the same FEC encoder.
Figure 4B:
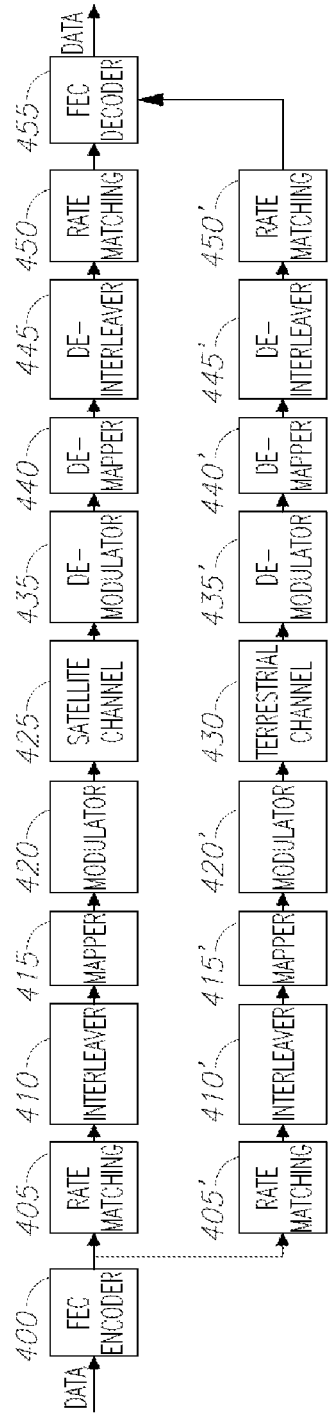

FIGS. 4A and 4B present a schematic illustration of a method implemented according to an embodiment of the present invention for combining information conveyed along a satellite channel and a terrestrial channel, where both channels use the same FEC encoder, FIG. 4A illustrates such a method in which a simple LLR addition is implemented when the information from the two channels is combined, whereas FIG. 4B illustrates such a method in which an iterative process is carried out between the two decoders when the information from the two channels is combined.

FIG. 4 presents a schematic illustration of a method implemented according to an embodiment of the present invention in a system 400 where both channels (the satellite channel and the terrestrial channel) use the same FEC.

In the example illustrated in FIG. 4A, the signal (data) is introduced to the LDPC encoder 400 which is a FEC encoder/decoder of the type low-density parity-check (LDPC), which is the coding scheme used in DVB standards which are typically implemented for satellite communications. The output from LDPC encoder 400 undergoes a rate matching (Repetition and/or Puncturing) in block 410 in the satellite channel and in block 410' in the terrestrial repeater channel, whereby some of the bits are repeated or omitted.

Next, bits are interleaved on both, the satellite and the terrestrial repeater channel, in interleavers (II) 410 and 410', respectively, which are configured to change the order by which the bits are transmitted. The interleavers perform a known permutation of the input bits.

The inventors have found that in a case where a relatively very long interleaving is required, a single structured interleaver (such as a block interleaver or a convolutional interleaver), might not be enough to achieve the required randomness. Therefore, according to another aspect of the present invention, in case of relatively very long interleaving it is proposed by the inventors to apply a concatenation of two interleavers, for example, one being a convolutional interleaver and the other being a pseudo random block interleaver.

The interleaved information bits in each of the channels are mapped in mapper 415 and 415', respectively, modulated in modulator 420 and 520', respectively, and transmitted to the medium by the respective blocks Satellite Channel 425 for the satellite channel and Terrestrial Channel" 430 for the terrestrial channel.

At a receiver side, the two signals undergo the inverse operations as they are de-modulated by de-modulators 435 and 435' respectively, followed by the respective de-mappers 440 and 440' and de-interleavers 445 and 445'. After carrying out rate matching for the two signals in blocks 450 and 450', both signals are introduced at the LLR combiner 455 where the respective LLR is computed for each of the received bits, and the LLR estimations from the two channels are combined. The combined outcome is then forwarded to the FEC decoder (LDPC in the present case), where the code information is utilized in order to complete the decoding process.

FIG. 4B illustrates a similar process, but in this case, no LLR combiner is used, and the signals from both channels, the satellite channel and the terrestrial channel are forwarded to FEC decoder 455 for iterative decoding.

Figure 5A:
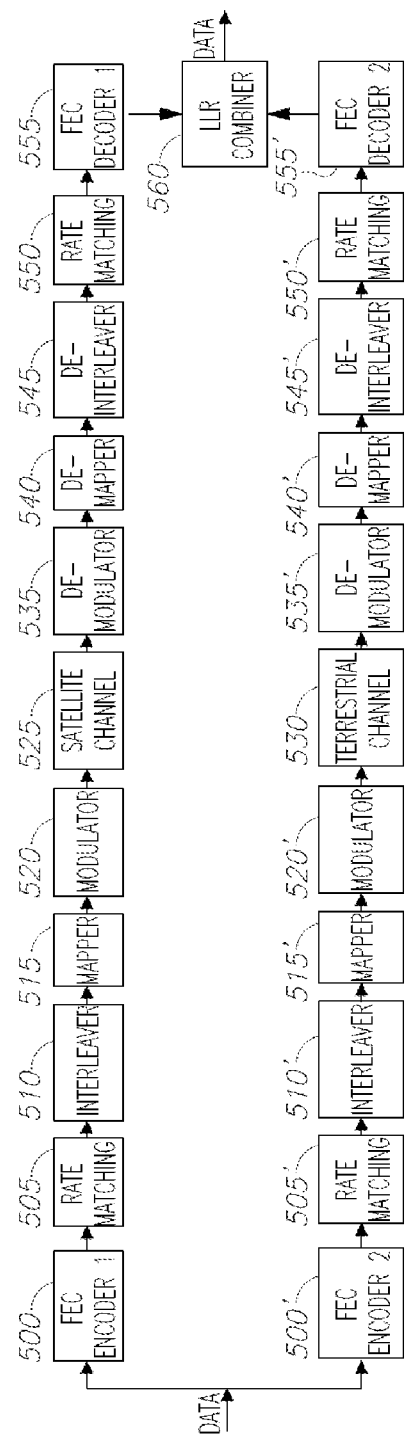
FIGS. 5A and 5B present a schematic illustration of a method implemented according to an embodiment of the present invention for combining information conveyed along a satellite channel and a terrestrial channel, where each of the two channels use a different FEC encoder than the other.
Figure 5B:
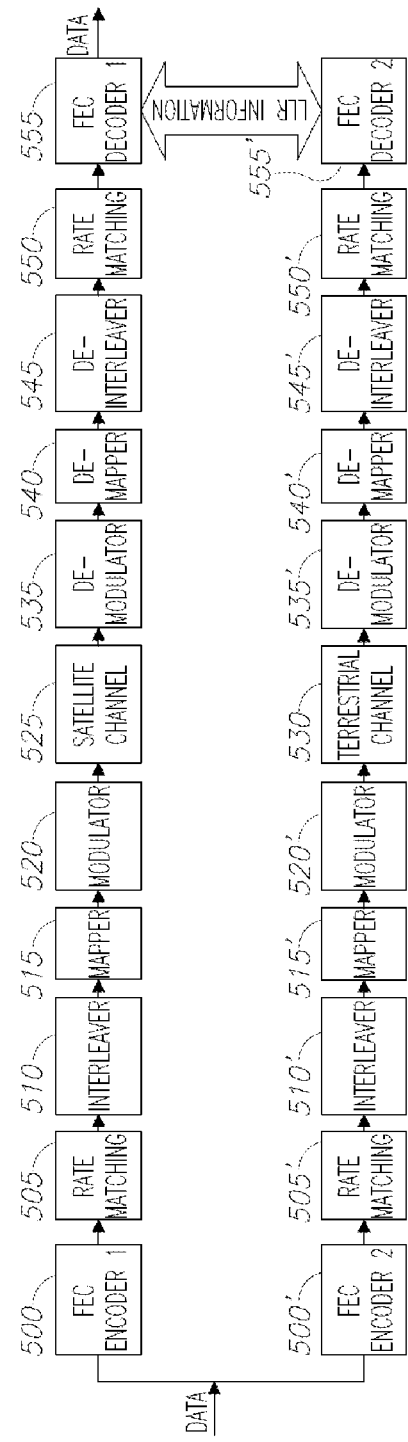

FIGS. 5A and 5B present a schematic illustration of a method implemented according to another embodiment of the present invention. As may be seen in this example, the information stream feeds two different encoders 500 and 500' (as opposed to the single LDPC encoder illustrated in FIGS. 4A and 4B). After following the processes along the satellite channel and along the terrestrial channel as explained in connection with FIGS. 4A and 4B above, the two streams are decoded, each by its own respective decoder, 555 and 555'. The output of the two decoders is forwarded to LLR combiner 560 (where the LLRs are of the information bits or data bits (as opposed for example to the embodiment described in FIGS. 4A and 4B above, where the LLRs are of the coded bits) according to the embodiment illustrated in FIG. 5A, or they iteratively exchange information between themselves, thus forming a turbo-decoder configuration, according to the embodiment illustrated in FIG. 5B.

The alternative illustrated in FIG. 5A is obviously a simpler implementation of the preceding embodiment, but one that may be just as effective as the previous example.

Figure 6:
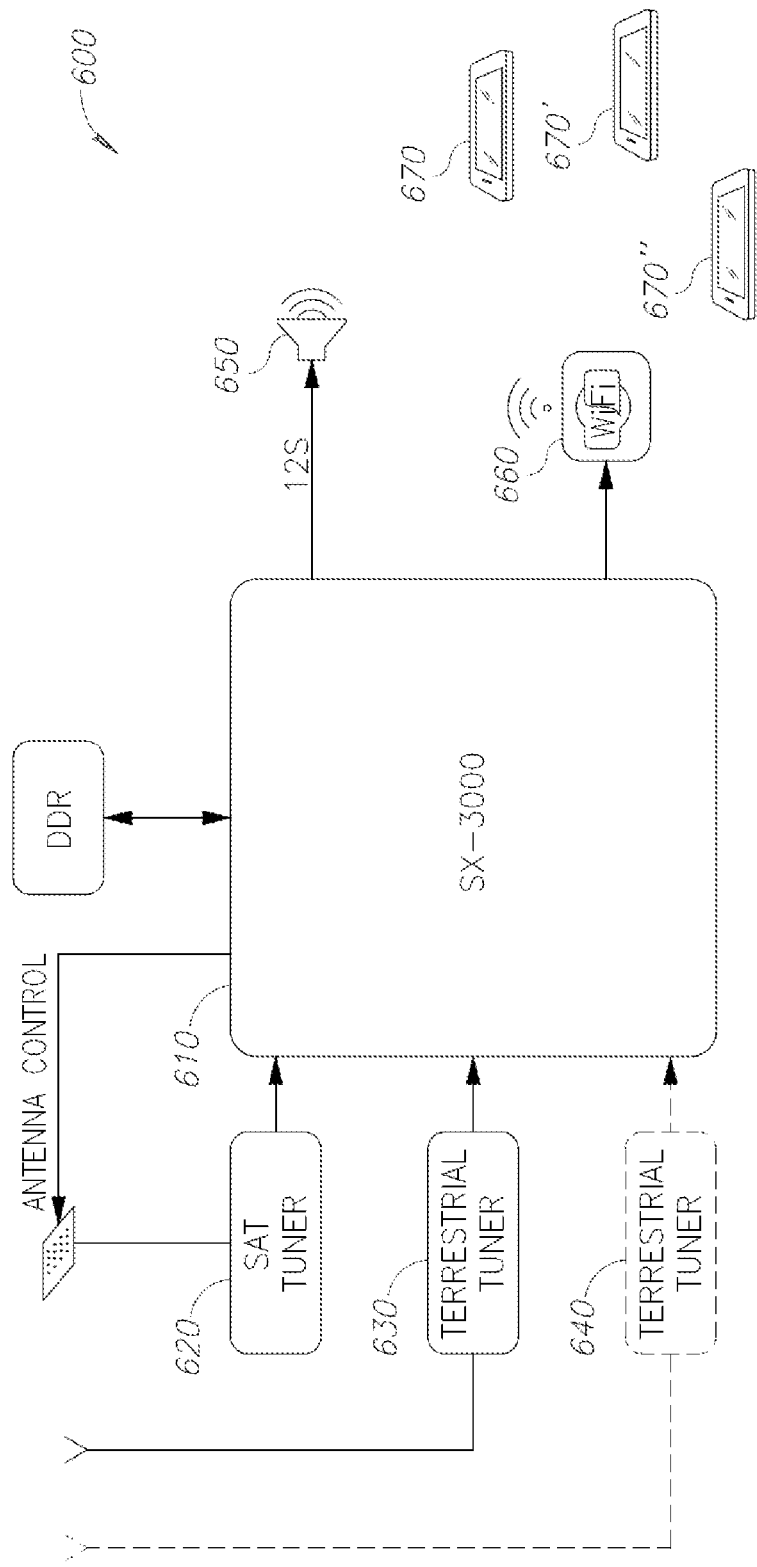
FIG. 6 demonstrates a block diagram of a device construed according to an embodiment of the present invention that can implemented in a car TV or a car radio.

FIG. 6 demonstrates a block diagram of a device construed according to an embodiment of apparatus 600 construed according to the present invention, that can implemented in a car TV or a car radio.

In this example, a typical car solution for radio or TV reception based on device 610 is shown in FIG. 6. Device 610 enables diversity by combining inputs received from a plurality of different antennas via their respective tuners (in this example 620, 630 and optionally 640). A TV output can be transmitted either in transport stream format (650) or can be transmitted by using Wi-Fi type of transmission (660), to several tablets (670, 670' and 670") as depicted in FIG. 6.

In a simulation made in order to evaluate the performance that may be achieved by using the solution proposed by the present invention of combining information conveyed along a satellite link with information conveyed along a terrestrial link, each link with its own interleaver, 3D maps of several cities were used, along with a ray tracing software and a driving model.

The driving model was based on a random path, where the speed between junctions, the probability of encountering a stop sign, a give way sign and a traffic light, as well as the waiting time involved with each such case, were randomly chosen according to certain pre-defined probabilities. It was assumed that a bandwidth of 10 MHz around the 2 GHz band is available while the transmitting power was a parameter that was optimized in the simulation.

In this simulation, it was shown that by applying a proper design, a very high service availability may be achieved, even in core urban areas, while only a relatively small number of terrestrial repeaters are required. This kind of blockage protection technology is especially relevant to the Ka band since it handles deep short (tens of seconds) rain fades in the same manner as it handles blockages due to the existence of geographical obstacles.

The present invention has been described using detailed descriptions of embodiments thereof that are provided by way of example and are not intended to limit the scope of the invention in any way. The described embodiments comprise different features, not all of which are required in all embodiments of the invention. Some embodiments of the present invention utilize only some of the features or possible combinations of the features.

Variations of embodiments of the present invention that are described and embodiments of the present invention comprising different combinations of features noted in the described embodiments will occur to persons of the art. The scope of the invention is limited only by the following claims.

The invention claimed is:

1. A method for use in a satellite communications network for providing broadcasting services to a mobile terminal, wherein said method comprises:

duplicating bits comprised in communications to be broadcasted by a satellite, thereby forming a first stream of bits and a second stream of bits;

conveying the first stream of bits in an encoded form along a satellite channel and the second stream of bits in an encoded form along a terrestrial channel, and wherein the first stream of bits is encoded differently than the encoding at which the second stream of bits is encoded; and combining bits conveyed along the satellite channel with bits conveyed along the terrestrial channel to obtain a combined stream of bits, wherein the step of conveying the first stream of bits comprises:

encoding input bits comprised in the communications that will be transmitted from the satellite;

applying a rate matching mechanism upon the encoded bits;

interleaving the encoded bits by performing a pre-determined permutation thereon;

modulating the interleaved bits and transmitting the modulated bits towards a receiver;

receiving the modulated bits;

demodulating the received bits;

performing an inverse permutation on the demodulated bits;

calculating a corresponding Log Likelihood Ratio (LLR) for each of the received bits;

combining the demodulated bits that have undergone the inverse permutation with corresponding bits received from the terrestrial channel; and outputting the combined bits by the mobile terminal, and wherein the step of interleaving the encoded bits further comprises carrying out de-repetition and de-puncturing, wherein punctured bits are replaced by LLR of the value 0.

2. A method for use in a satellite communications network for providing broadcasting services to a mobile terminal, wherein said method comprises:

duplicating bits comprised in communications to be broadcasted by a satellite, thereby forming a first stream of bits and a second stream of bits;

conveying the first stream of bits in an encoded form along a satellite channel and the second stream of bits in an encoded form along a terrestrial channel, and wherein the first stream of bits is encoded differently than the encoding at which the second stream of bits is encoded; and combining bits conveyed along the satellite channel with bits conveyed along the terrestrial channel to obtain a combined stream of bits, wherein the step of conveying the first stream of bits comprises:

encoding input bits comprised in the communications that will be transmitted from the satellite;

applying a rate matching mechanism upon the encoded bits;

interleaving the encoded bits by performing a pre-determined permutation thereon;

modulating the interleaved bits and transmitting the modulated bits towards a receiver;

receiving the modulated bits;

demodulating the received bits;

performing an inverse permutation on the demodulated bits;

calculating a corresponding Log Likelihood Ratio (LLR) for each of the received bits;
combining the demodulated bits that have undergone the inverse permutation with corresponding bits received from the terrestrial channel; and
outputting the combined bits by the mobile terminal, wherein the step of conveying the second stream of bits comprises:
applying a rate matching mechanism upon bits to be conveyed along the terrestrial channel in their encoded form;
interleaving the encoded bits by performing a predetermined permutation thereon;
modulating the interleaved bits and transmitting the modulated bits towards a receiver;
receiving the modulated bits;
demodulating the received bits;
performing an inverse permutation on the demodulated bits; and
synchronizing forwarding of the demodulated bits that have undergone the inverse permutation, for their combination with corresponding bits that have undergone inverse permutation at the satellite channel, and
wherein the encoding mechanism applied on bits for their conveyance along the satellite channel and on bits to be conveyed along the terrestrial channel, is the same.

3. The method of claim 2, wherein the encoding mechanism is of low-density parity-check (LDPC) type.

4. A method for use in a satellite communications network for providing broadcasting services to a mobile terminal, wherein said method comprises:
duplicating bits comprised in communications to be broadcasted by a satellite, thereby forming a first stream of bits and a second stream of bits;
conveying the first stream of bits in an encoded form along a satellite channel and the second stream of bits in an encoded form along a terrestrial channel, and wherein the first stream of bits is encoded differently than the encoding at which the second stream of bits is encoded; and
combining bits conveyed along the satellite channel with bits conveyed along the terrestrial channel to obtain a combined stream of bits,
wherein the step of conveying the first stream of bits comprises:
encoding input bits comprised in the communications that will be transmitted from the satellite;
applying a rate matching mechanism upon the encoded bits;
interleaving the encoded bits by performing a predetermined permutation thereon;
modulating the interleaved bits and transmitting the modulated bits towards a receiver;
receiving the modulated bits;
demodulating the received bits;
performing an inverse permutation on the demodulated bits;
calculating a corresponding Log Likelihood Ratio (LLR) for each of the received bits;
combining the demodulated bits that have undergone the inverse permutation with corresponding bits received from the terrestrial channel; and
outputting the combined bits by the mobile terminal, wherein the step of conveying the second stream of bits comprises:
applying a rate matching mechanism upon bits to be conveyed along the terrestrial channel in their encoded form;
interleaving the encoded bits by performing a predetermined permutation thereon;
modulating the interleaved bits and transmitting the modulated bits towards a receiver;
receiving the modulated bits;
demodulating the received bits;
performing an inverse permutation on the demodulated bits; and
synchronizing forwarding of the demodulated bits that have undergone the inverse permutation, for their combination with corresponding bits that have undergone inverse permutation at the satellite channel, and
wherein the encoding mechanism applied on bits belonging to the first stream of bits is different from the encoding mechanism applied on bits belonging to the second stream of bits.

5. A method for use in a satellite communications network for providing broadcasting services to a mobile terminal, wherein said method comprises:
duplicating bits comprised in communications to be broadcasted by a satellite, thereby forming a first stream of bits and a second stream of bits;
conveying the first stream of bits in an encoded form along a satellite channel and the second stream of bits in an encoded form along a terrestrial channel, and wherein the first stream of bits is encoded differently than the encoding at which the second stream of bits is encoded; and
combining bits conveyed along the satellite channel with bits conveyed along the terrestrial channel to obtain a combined stream of bits,
wherein the step of conveying the first stream of bits comprises:
encoding input bits comprised in the communications that will be transmitted from the satellite;
applying a rate matching mechanism upon the encoded bits;
interleaving the encoded bits by performing a predetermined permutation thereon;
modulating the interleaved bits and transmitting the modulated bits towards a receiver;
receiving the modulated bits;
demodulating the received bits;
performing an inverse permutation on the demodulated bits;
calculating a corresponding Log Likelihood Ratio (LLR) for each of the received bits;
combining the demodulated bits that have undergone the inverse permutation with corresponding bits received from the terrestrial channel; and
outputting the combined bits by the mobile terminal, and
wherein the step of interleaving the encoded bits comprises applying a concatenation of two interleavers.

6. The method of claim 5, wherein one of the two interleavers is a convolutional interleaver and the other is a pseudo random block interleaver.

7. A method for use in a satellite communications network for providing broadcasting services to a mobile terminal, wherein said method comprises:
duplicating bits comprised in communications to be broadcasted by a satellite, thereby forming a first stream of bits and a second stream of bits;

conveying the first stream of bits in an encoded form along a satellite channel and the second stream of bits in an encoded form along a terrestrial channel, and wherein the first stream of bits is encoded differently than the encoding at which the second stream of bits is encoded; and combining bits conveyed along the satellite channel with bits conveyed along the terrestrial channel to obtain a combined stream of bits, and wherein the broadcasted communications are transmitted at a frequency within a frequencies range extending from 12 to 40 GHz.

8. A system for providing broadcasting services to a mobile terminal in a satellite communications network, said system comprising:

a first sub-system configured to convey a first stream of bits in an encoded form along a satellite channel;

a second sub-system configured to convey a second stream of bits, being a duplicate of said first stream of bits, in an encoded form along a terrestrial channel;

wherein said first sub-system comprises:

a processor configured to calculate a Log Likelihood Ratio (LLR) for each of the bits received along the satellite channel, and a combiner configured to combine bits received along said both satellite and terrestrial channels into combined bits, based on at least the respective LLR calculated by the processor, an encoder configured to encode the first stream of bits that will be transmitted along the satellite channel;

the processor being further configured to:
apply a rate matching mechanism upon the encoded bits;
interleave encoded bits by performing a pre-determined permutation thereon; and
modulate the interleaved bits;

a transmitter configured to transmit the modulated bits along a satellite channel towards a receiver;

a receiver configured to receive the modulated bits;

the processor being further configured to:
demodulate the received bits;
calculate a corresponding LLR for each of the received bits;
perform an inverse permutation on the demodulated bits;
combine the demodulated bits that have undergone the inverse permutation with corresponding bits received from the terrestrial channel; and
output the combined bits, and wherein the processor is further configured to carry out de-repetition and de-puncturing of the bits contained in said first stream of bits following their interleaving, and wherein punctured bits are replaced by LLR of the value 0.

9. A system for providing broadcasting services to a mobile terminal in a satellite communications network, said system comprising:

a first sub-system configured to convey a first stream of bits in an encoded form along a satellite channel;

a second sub-system configured to convey a second stream of bits, being a duplicate of said first stream of bits, in an encoded form along a terrestrial channel;

wherein said first sub-system comprises:

a processor configured to calculate a Log Likelihood Ratio (LLR) for each of the bits received along the satellite channel, and a combiner configured to combine bits received along said both satellite and terrestrial channels into combined bits, based on at least the respective LLR calculated by the processor;

an encoder configured to encode the first stream of bits that will be transmitted along the satellite channel;

the processor being further configured to:
apply a rate matching mechanism upon the encoded bits;
interleave encoded bits by performing a pre-determined permutation thereon; and
modulate the interleaved bits;

a transmitter configured to transmit the modulated bits along a satellite channel towards a receiver;

a receiver configured to receive the modulated bits;

the processor being further configured to:
demodulate the received bits;
calculate a corresponding LLR for each of the received bits;
perform an inverse permutation on the demodulated bits;
combine the demodulated bits that have undergone the inverse permutation with corresponding bits received from the terrestrial channel; and
output the combined bits, and wherein the processor is configured to carry out the interleaving the encoded bits by applying a concatenation of two interleavers.

10. The system of claim 9, wherein one of the two interleavers is a convolutional interleaver and the other is a pseudo random block interleaver.

11. A system for providing broadcasting services to a mobile terminal in a satellite communications network, said system comprising:

a first sub-system configured to convey a first stream of bits in an encoded form along a satellite channel;

a second sub-system configured to convey a second stream of bits, being a duplicate of said first stream of bits, in an encoded form along a terrestrial channel;

wherein said first sub-system comprises:

a processor configured to calculate a Log Likelihood Ratio (LLR) for each of the bits received along the satellite channel, and a combiner configured to combine bits received along said both satellite and terrestrial channels into combined bits, based on at least the respective LLR calculated by the processor;

an encoder configured to encode the first stream of bits that will be transmitted along the satellite channel;

the processor being further configured to:
apply a rate matching mechanism upon the encoded bits;
interleave encoded bits by performing a pre-determined permutation thereon; and
modulate the interleaved bits;

a transmitter configured to transmit the modulated bits along a satellite channel towards a receiver;

a receiver configured to receive the modulated bits;

the processor being further configured to:
demodulate the received bits;
calculate a corresponding LLR for each of the received bits;
perform an inverse permutation on the demodulated bits;
combine the demodulated bits that have undergone the inverse permutation with corresponding bits received from the terrestrial channel; and output the combined bits, and
wherein the transceiver is configured to transmit the first stream of bits at a frequency within a frequencies range extending from 12 GHz to 40 GHz.

* * * * *